(12) United States Patent
Toriumi

(10) Patent No.: US 8,431,496 B2
(45) Date of Patent: Apr. 30, 2013

(54) SEMICONDUCTOR DEVICE AND MANUFACTURING METHOD THEREOF

(75) Inventor: Satoshi Toriumi, Ebina (JP)

(73) Assignee: Semiconductor Energy Labortory Co., Ltd., Atsugi-shi, Kanagawa-ken (JP)

( * ) Notice: Subject to any disclaimer, the term of this patent is extended or adjusted under 35 U.S.C. 154(b) by 260 days.

(21) Appl. No.: 13/035,038

(22) Filed: Feb. 25, 2011

(65) Prior Publication Data
US 2011/0215332 A1 Sep. 8, 2011

(30) Foreign Application Priority Data
Mar. 5, 2010 (JP) .................................. 2010-048817

(51) Int. Cl.
*H01L 29/04* (2006.01)
(52) U.S. Cl.
USPC ........ 438/798; 257/60; 257/66; 257/E29.003; 257/E21.412; 257/E21.414; 257/E21.633; 438/158
(58) Field of Classification Search .................... 257/57, 257/60, 66, E29.003, E21.412, E21.414, 257/E21.633; 438/158, 798
See application file for complete search history.

(56) References Cited

U.S. PATENT DOCUMENTS

| | | | | |
|---|---|---|---|---|
| 5,998,229 | A | * | 12/1999 | Lyu et al. ........................ 438/30 |
| 2008/0308807 | A1 | * | 12/2008 | Yamazaki et al. ............... 257/59 |
| 2009/0002591 | A1 | | 1/2009 | Yamazaki et al. |
| 2009/0026453 | A1 | | 1/2009 | Yamazaki |
| 2009/0047758 | A1 | * | 2/2009 | Yamazaki et al. ............. 438/158 |
| 2009/0137087 | A1 | * | 5/2009 | Yamazaki et al. ............. 438/158 |
| 2009/0309100 | A1 | * | 12/2009 | Moriguchi et al. ............. 257/59 |
| 2010/0035379 | A1 | * | 2/2010 | Miyairi et al. ................. 438/104 |
| 2012/0217500 | A1 | * | 8/2012 | Park et al. ........................ 257/59 |
| 2013/0037808 | A1 | * | 2/2013 | Kishida et al. .................. 257/57 |

FOREIGN PATENT DOCUMENTS

| | | |
|---|---|---|
| JP | 10-270706 A | 10/1998 |
| JP | 2007-220816 | 8/2007 |
| JP | 2007-220816 A | 8/2007 |
| JP | 2009-044134 A | 2/2009 |
| JP | 2009-055011 A | 3/2009 |

* cited by examiner

*Primary Examiner* — Allan R Wilson
(74) *Attorney, Agent, or Firm* — Eric J. Robinson; Robinson Intellectual Property Law Office, P.C.

(57) ABSTRACT

A threshold voltage of a thin film transistor is adjusted. The thin film transistor is manufactured through the steps of: introducing a semiconductor material gas into a treatment chamber; forming a semiconductor film in the treatment chamber over a gate insulating layer provided covering a gate electrode; evacuating the semiconductor material gas in the treatment chamber; introducing rare gas into the treatment chamber; performing plasma treatment on the semiconductor film in the treatment chamber; forming an impurity semiconductor film over the semiconductor film; processing the semiconductor film and the impurity semiconductor film into island shapes, so that a semiconductor stack is formed; forming source and drain electrodes in contact with an impurity semiconductor layer included in the semiconductor stack. Argon is preferably used as the rare gas. The rare gas element is preferably contained in the semiconductor film at $2.5 \times 10^{18}$ $cm^{-3}$ or more.

10 Claims, 11 Drawing Sheets

104 105 100 102

106

112

108 110

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

In recent years, thin film transistors (TFTs) over a substrate having an insulating surface (e.g., a glass substrate) have been attracting attention. TFTs are formed using a semiconductor thin film with a thickness of several nanometers to several hundreds of nanometers. As a semiconductor thin film for forming the TFTs, an amorphous semiconductor film or a polycrystalline semiconductor film is mainly used. Further, a microcrystalline semiconductor film is also known (e.g., Patent Document 1).

A threshold voltage is one of important parameters which determine performance of TFTs. For example, in the case of an n-channel TFT, when a gate voltage is zero, a TFT having a threshold voltage higher than 0 V (which is normally-off) does not turn on and almost no current flows between a source and a drain. On the other hand, when a gate voltage is zero, a TFT having a threshold voltage lower than 0 V (which is normally-on) turns on and current flows between a source and a drain. Therefore, it is preferable that threshold voltage of a TFT as a switching element is high. A number of attempts has been made so far to adjust the threshold voltage of TFTs (e.g., Patent Document 2).

REFERENCES

[Patent Document 1] Japanese Published Patent Application No. 2009-044134
[Patent Document 2] Japanese Published Patent Application No. 2009-055011

SUMMARY OF THE INVENTION

It is an object of one embodiment of the present invention to provide a method for adjusting a threshold voltage of TFTs.

It is an object of one embodiment of the present invention to provide normally-off TFTs whose threshold voltage is adjusted.

One embodiment of the present invention is a method for manufacturing TFTs in which a semiconductor film is formed and plasma treatment is performed in an atmosphere that contains a gas having low reactivity with the semiconductor film at high concentration. Here, "the gas having low reactivity with the semiconductor film" refers to a gas which does not generate compounds over a surface of the semiconductor film or in the semiconductor film even when the plasma treatment is performed on the semiconductor film and which hardly etches the semiconductor film. As an example of such a gas, a rare gas can be given. Argon (Ar) is preferably used as the rare gas.

In the manufacturing method of the TFTs, it is preferable that the plasma treatment on the semiconductor film is performed successively in the same treatment chamber as a step for forming the semiconductor film. It is preferable that the atmosphere that contains a gas having low reactivity with the semiconductor film at high concentration, which is used when the plasma treatment is performed, be different from an atmosphere used when the semiconductor film is formed only in the kind of gas in the treatment chamber and be almost the same as the atmosphere used when the semiconductor film is formed in the pressure and the temperature. In the case of performing the plasma treatment on the semiconductor film at almost the same pressure and temperature as the atmosphere of when the semiconductor film is formed, the change from the atmosphere of when the semiconductor film is formed is small, so that throughput in a manufacturing process of TFTs can be increased.

One embodiment of the present invention is a TFT in which the concentration of a rare gas element (e.g., argon) contained in a semiconductor film is greater than or equal to $2.5 \times 10^{18}$ $cm^{-3}$. When the concentration of the rare gas element contained in the semiconductor film is set to be in the above range, threshold voltage of the TFT can be adjusted.

Note that in this specification, a "film" refers to a film which is formed over the entire surface of an object by a CVD method (including a plasma CVD method and the like), a sputtering method, or the like. On the other hand, a "layer" refers to a layer which is formed by processing a film or a layer which is formed over an entire surface of an object and does not need further processing.

According to one embodiment of the present invention, threshold voltage of TFTs can be adjusted without complicating a process.

According to one embodiment of the present invention, a normally-off TFT whose threshold voltage is adjusted can be obtained.

BRIEF DESCRIPTION OF THE DRAWINGS

In the accompanying drawings.

DETAILED DESCRIPTION OF THE INVENTION

Figure 1A:
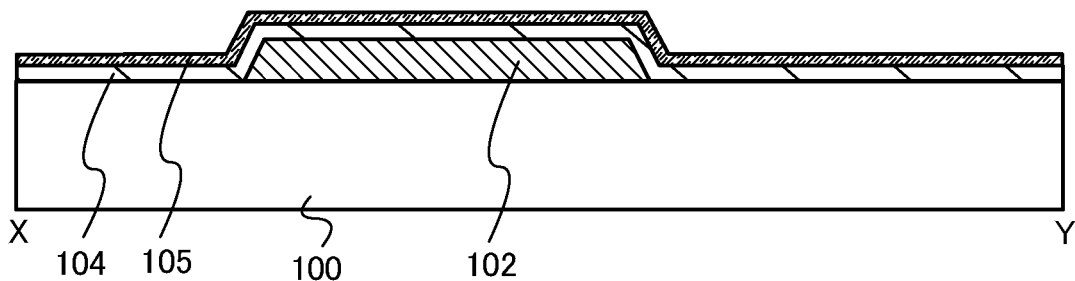
FIGS. 1A to 1C illustrate a method for manufacturing a TFT according to one embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments and example below. In describing structures of the present invention with reference to the drawings, the same reference numerals are used in common for the same portions in different drawings. Note that the same hatching pattern is applied to similar portions, and the similar portions are not especially denoted by reference numerals in some cases. In addition, for convenience, an insulating layer is, in some cases, not illustrated in top views.

Embodiment

Furthermore, hereinafter, ordinal numbers, such as "first" and "second," are used merely for convenience, and the present invention is not limited to the numbers.

First, a method for manufacturing a TFT that is an embodiment of the present invention will be described.

A first conductive layer 102 is selectively formed over a substrate 100 (FIG. 1A).

The substrate 100 is an insulating substrate. As the substrate 100, in addition to a glass substrate, a quartz substrate and a ceramic substrate, a plastic substrate or the like with heat resistance that is high enough to withstand a process temperature in this manufacturing process can be used. Note that the substrate 100 is not necessarily a light-transmitting substrate. Without limitation thereto, the substrate 100 does not necessarily have an insulating property.

Note that the first conductive layer 102 forms at least a gate electrode. The first conductive layer 102 may be formed in such a manner that a conductive material film is formed and is processed by a photolithography method.

Next, the substrate 100 over which the first conductive layer 102 is formed is introduced into a treatment chamber 200 (see FIG. 4) and a first insulating layer 104 is formed so as to cover the first conductive layer 102 (FIG. 1A).

Note that the first insulating layer 104 forms at least a gate insulating layer. The first insulating layer 104 may be formed using an insulating material. As examples of the insulating material, silicon oxide, silicon oxynitride, silicon nitride oxide, or silicon nitride can be given.

Note that "silicon oxynitride" contains more oxygen than nitrogen, and in the case where measurements are conducted using Rutherford backscattering spectrometry (RBS) and hydrogen forward scattering spectrometry (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively.

Further, "silicon nitride oxide" contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Here, an example of a plasma CVD apparatus having the treatment chamber 200 which is used in the manufacturing method of a TFT of one embodiment of the present invention is described with reference to FIG. 4.

Figure 4:
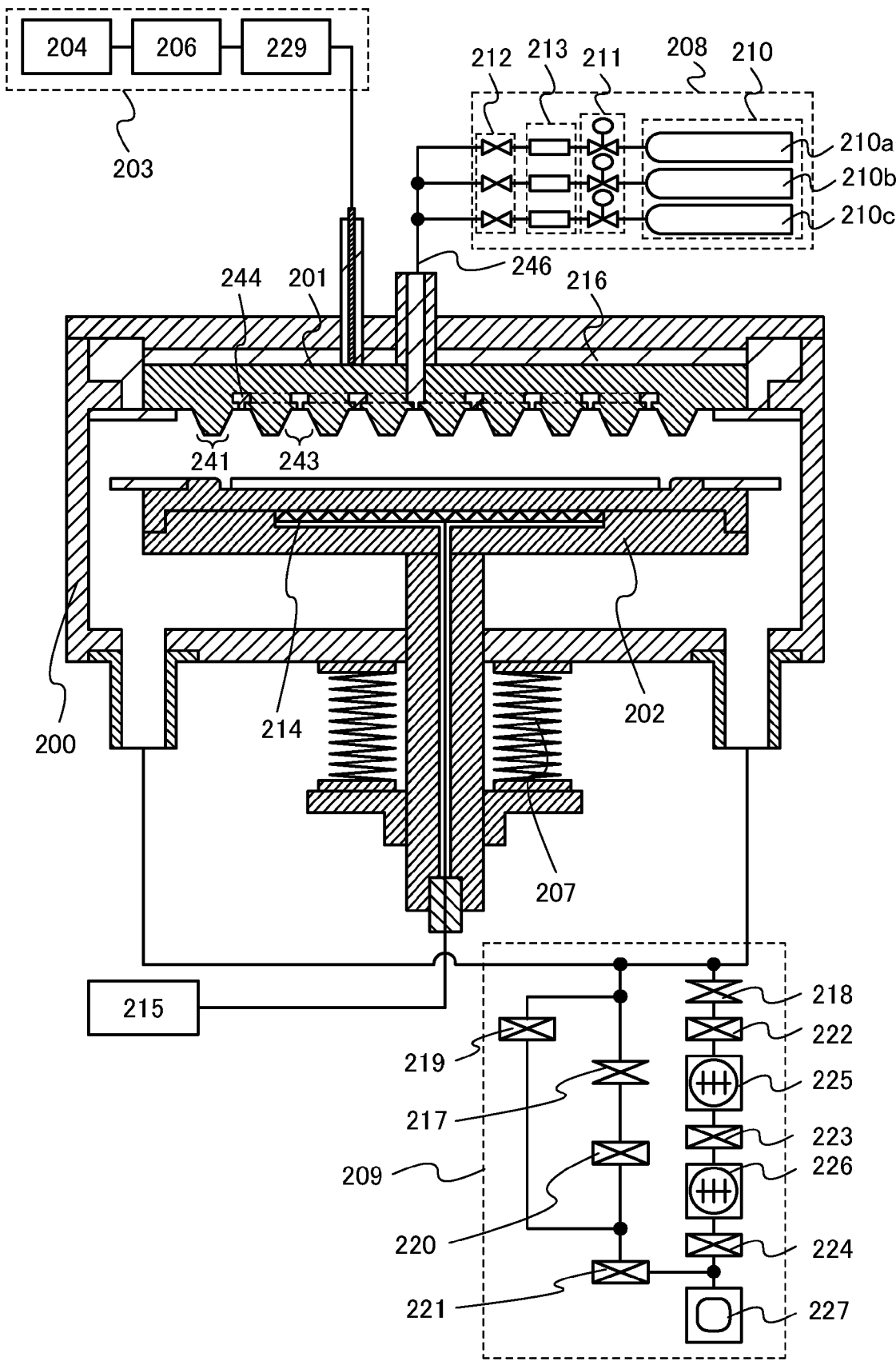
FIG. 4 illustrates an apparatus used for a method for manufacturing a TFT according to one embodiment of the present invention.

FIG. 4 illustrates a structure of a treatment chamber of a plasma CVD apparatus. The treatment chamber 200 is formed using a material having rigidity such as aluminum or stainless steel and has a structure in which the inside of the treatment chamber 200 can be vacuum-evacuated. It is preferable that the treatment chamber 200 be formed using stainless steel and the inside thereof be coated with aluminum by thermal spraying in order to increase its mechanical strength. In addition, it is preferable that the chamber of the plasma CVD apparatus illustrated in FIG. 4 can be disassembled for maintenance and that the inside thereof be regularly recoated with aluminum by thermal spraying. The treatment chamber 200 is provided with a first electrode 201 (also referred to as an upper electrode) and a second electrode 202 (also referred to as a lower electrode) which is opposite to the first electrode 201.

A high-frequency power supply unit 203 is connected to the first electrode 201. The second electrode 202 is grounded, and a substrate can be placed on the second electrode 202. The first electrode 201 is insulated from a chamber wall of the treatment chamber 200 by an insulating material 216 so that high-frequency power does not leak. In the case where a ceramic material is used for the insulating material 216, it is difficult to use a knife-edge-type metal-seal flange for sealing of the upper electrode and thus, an O-ring seal is preferably used.

Although the first electrode 201 and the second electrode 202 have a capacitively coupled (parallel plate) structure in FIG. 4, an embodiment of the present invention is not limited thereto. Another structure such as an inductively coupled structure or the like may be employed as long as the structure can generate glow discharge plasma in the treatment chamber 200 by supplying high-frequency power.

The first electrode 201 is an electrode that is projected and depressed by having projected portions 241 and depressed portions 243 arranged regularly, preferably at regular intervals. In other words, the projected portions 241 formed using projected structure bodies are arranged regularly, preferably at regular intervals. In the depressed portions 243 of the first electrode 201, hollow portions 244 which are connected to a gas supply unit 208 are provided. In other words, the depressed portions 243 form a common plane where gas supply ports are provided. Note that region near a surface of the second electrode 202 is regarded as the projected portions 241 and region distant from the surface of the second electrode 202 is regarded as the depressed portions 243.

The hollow portions 244 are connected to a cylinder 210a, which is filled with semiconductor material gas, in the gas supply unit 208 through a gas line 246. Accordingly, the semiconductor material gas is supplied from gas supply ports of the hollow portions 244 provided in the depressed portions 243 to the treatment chamber 200.

The gas supply unit 208 includes a cylinder group 210 filled with a plurality of gases, a pressure adjusting valve 211, a stop valve 212, a mass flow controller 213, and the like. The cylinder group 210 includes the cylinder 210a filled with semiconductor material gas, a cylinder 210b filled with hydrogen, and a cylinder 210c filled with rare gas.

As examples of the semiconductor material gas filled in the cylinder 210a, a silane gas, a disilane gas, a germane gas, a digermane gas, and the like can be given; however, the semiconductor material gas is not limited thereto and other deposition gas may be used.

As examples of the rare gas filled in the cylinder 210c, Ar, Xe, Kr, and the like can be given and Ar is preferably employed.

A substrate heater 214, a temperature of which is controlled by a heater controller 215, is provided in the second electrode 202. In the case where the substrate heater 214 is provided inside the second electrode 202, a thermal conduction heating method is employed. For example, the substrate heater 214 may include a sheathed heater.

The high-frequency power supply unit 203 includes a high-frequency power source 204, a matching box 206, and a high-frequency cut filter 229. High-frequency power supplied from the high-frequency power source 204 is supplied to the first electrode 201.

The high-frequency power source 204 may have a structure capable of supplying power at a high-frequency of 60 MHz or less. In the case where a large substrate of the seventh or later generation is used as a substrate placed on the second electrode 202, the high-frequency power source 204 preferably supplies high-frequency power at a wavelength of approximately 10 m or more. For example, a high-frequency power with a frequency of 13.56 MHz or less, preferably, greater than or equal to 3 MHz and less than or equal to 13.56 MHz is supplied. When the high-frequency power source 204 supplies high-frequency power at a frequency in the above range, even if a large substrate of the seventh (e.g., 1870 mm×2200 mm) or later generation is placed on the second electrode 202 and glow discharging is performed, plasma can be generated uniformly without the adverse effect of a surface standing wave; therefore, a film which is uniform and has good film quality can be formed over an entire surface even in the case of the large substrate.

Note that when power source with a frequency of 13.56 MHz is used for the high-frequency power source 204, it is preferable that a variable capacitor with a capacitance of 10 pF to 100 pF be used for the high-frequency cut filter 229.

By further using a coil for the high-frequency cut filter 229, a parallel resonance circuit using a coil and a variable capacitor may be formed.

An evacuation unit 209 connected to the treatment chamber 200 has a function of performing vacuum evacuation in the treatment chamber 200 and a function of controlling the pressure inside the treatment chamber 200 to be maintained at a predetermined level when a reaction gas is made to flow. The evacuation unit 209 includes a butterfly valve 217, a butterfly valve 218, a stop valve 219, a stop valve 220, a stop valve 221, a stop valve 222, a stop valve 223, a stop valve 224, a turbo molecular pump 225, a turbo molecular pump 226, a dry pump 227 and the like. Note that the turbo molecular pump 226 is connected to the dry pump 227 through the stop valve 224.

In the case of performing vacuum evacuation in the treatment chamber 200, first, the stop valve 219 and the stop valve 221 for rough vacuum are opened and the treatment chamber 200 is evacuated with the dry pump 227. Then, the stop valve 219 is closed and the butterfly valve 217 and the stop valve 220 are opened for vacuum evacuation. Further in the case of performing evacuation in the treatment chamber 200 to ultra-high vacuum with a pressure lower than $10^{-5}$ Pa, the treatment chamber 200 is evacuated with the dry pump 227. Then, the butterfly valve 217, the stop valve 220 and the stop valve 221 are closed, the butterfly valve 218, the stop valve 219, the stop valve 220, the stop valve 221, the stop valve 222, the stop valve 223 and the stop valve 224 are opened, and then vacuum evacuation is performed using the turbo molecular pumps 225 and 226 and the dry pump 227 which are connected in series. Note that, after the vacuum evacuation is performed, the treatment chamber 200 is preferably subjected to heat treatment so that degassing of the inner wall is performed.

A distance (also referred to as a gap) between the first electrode 201 and the second electrode 202 can be adjusted as appropriate. The gap between the electrodes can be adjusted in such a manner that the height of the second electrode 202 is changed in the treatment chamber 200. By using a bellows 207, the gap between the electrodes can be adjusted with the treatment chamber 200 maintained in a vacuum.

Figure 5A:
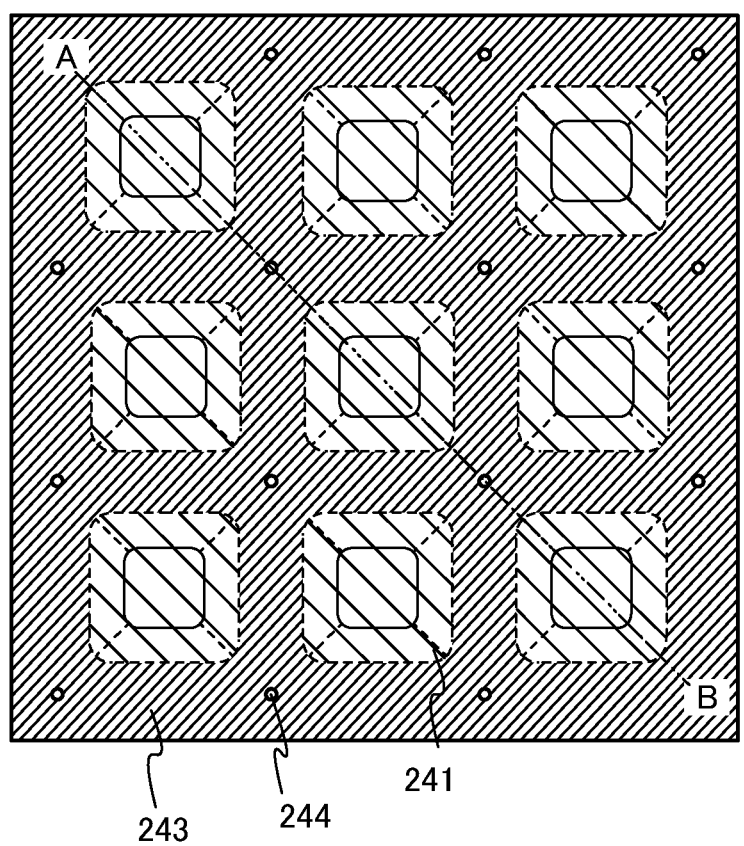
FIGS. 5A and 5B illustrate an apparatus used for a method for manufacturing a TFT according to one embodiment of the present invention.
Figure 5B:
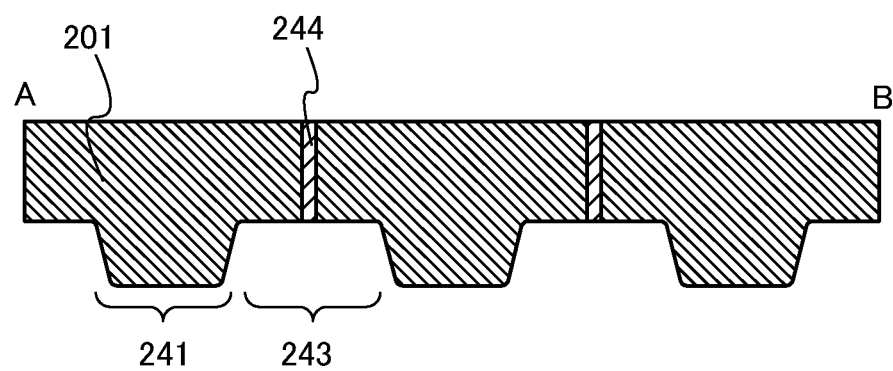
Figure 6A:
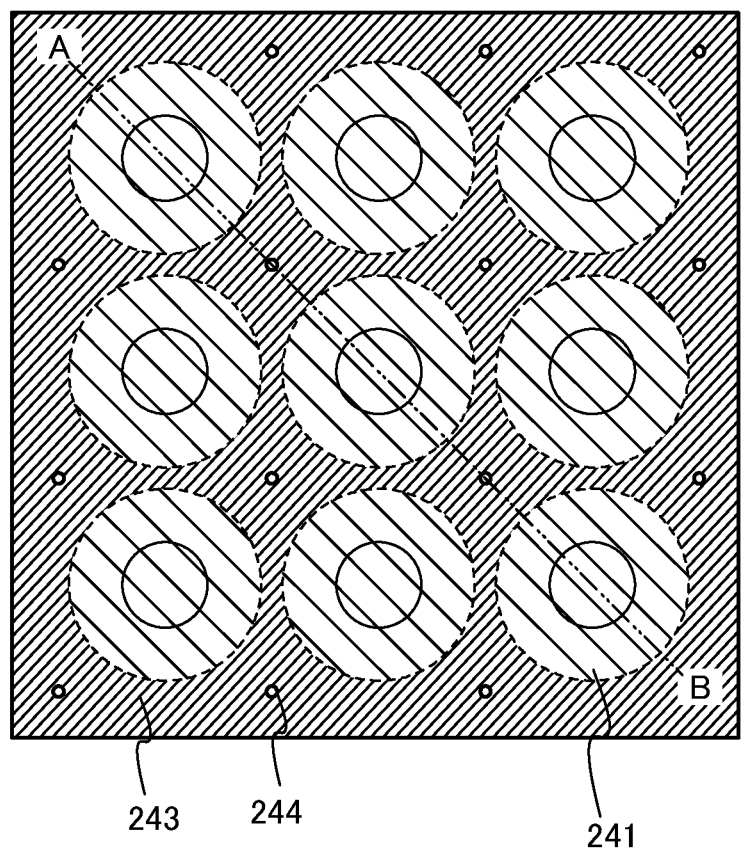
FIGS. 6A and 6B illustrate an apparatus used for a method for manufacturing a TFT according to one embodiment of the present invention.
Figure 6B:
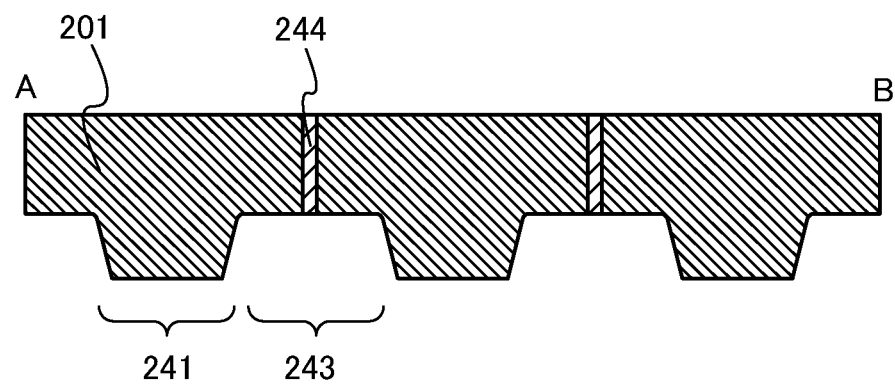

Here, examples of the shape of the first electrode 201 are described with reference to FIGS. 5A and 5B and FIGS. 6A and 6B. FIG. 5A and FIG. 6A are examples of plan views of the first electrode 201 seen from the second electrode 202 side. FIG. 5B and FIG. 6B are examples of cross-sectional views taken along line A-B in FIG. 5A and FIG. 6A. Note that in FIG. 5A and FIG. 6A, regions which are projected to the second electrode 202 side (that is, projected portions) are shown by a wide hatch pattern and regions which are depressed (that is, depressed portions) are shown by a narrow hatch pattern.

As shown in FIG. 5A, the gas supply ports of the hollow portions 244 provided in the depressed portions 243 are arranged regularly, preferably at regular intervals. In addition, as shown in FIG. 5B, the gas supply ports of the hollow portions 244 are provided in the depressed portions 243. The plurality of projected portions 241 are separated from one another and the depressed portions 243 are on one continuous plane. That is, the first electrode 201 shown in FIGS. 5A and 5B includes projected structure bodies provided so as to project over the common plane where the gas supply ports are provided, and the projected structure bodies are each isolated. Here, the projected portions 241 are truncated quadrangular pyramids. Note that the shape of the projected portions 241 is not limited thereto and may be a truncated triangular pyramid, a truncated pentagonal pyramid, a truncated hexagonal pyramid, or any other truncated polygonal pyramid as appropriate. Preferably, edges and corners of the projected portions 241 are roundly chamfered to form a truncated polygonal pyramid with the corners rounded. When the edges and corners of the projected portions 241 and the depressed portions 243 are roundly chamfered, concentration of an electric field can be relieved. Accordingly, local arc discharge can be suppressed, leading to less generation of particles.

Alternatively, as shown in FIG. 6A, the shape of the projected portions 241 may be a truncated cone and as shown in FIG. 6B, the gas supply ports of the hollow portions 244 may be provided in the depressed portions 243. Preferably, edges of the projected portions 241 are roundly chamfered to form a truncated cone with the edges rounded. When the projected portions 241 each have the shape of a truncated cone and the edges of the projected portions 241 and the depressed portions 243 are roundly chamfered, concentration of an electric field can be relieved. Accordingly, local arc discharge can be suppressed, leading to less generation of particles.

As the shapes of the projected portions 241 shown in FIGS. 5A and 5B and FIGS. 6A and 6B, although a truncated polygonal pyramid or a truncated cone with the corners rounded are described, the edges and corners of the truncated polygonal pyramid or the truncated cone may be chamfered without being rounded. For example, the projected portions 241 can be tapered and the corners of the projected portions 241 can be chamfered. Then, the corners of the depressed portions 243 may be chamfered. When the corners of the projected portions 241 and the depressed portions 243 are chamfered, concentration of an electric field therein can be relieved, leading to less generation of particles.

Alternatively, in FIGS. 5A and 5B and FIGS. 6A and 6B, edges and corners of the periphery of the gas supply ports of the hollow portions 244 may be roundly chamfered. Further, the periphery of the gas supply ports of the hollow portions 244 may be chamfered without being rounded, although not illustrated. Thus, concentration of an electric field in the periphery of the gas supply ports can also be relieved, leading to less generation of particles.

Note that the plasma CVD apparatus described with reference to FIG. 4, FIGS. 5A and 5B, and FIGS. 6A and 6B can be used in all processes of the manufacturing method of a TFT of one embodiment of the present invention in which a plasma CVD method is applied.

However, structure of a plasma CVD apparatus used in the manufacturing method of a TFT of one embodiment of the present invention is not limited to the plasma CVD apparatus described in FIG. 4, FIGS. 5A and 5B, and FIGS. 6A and 6B.

Next, the gases in the treatment chamber 200 are replaced and, in the treatment chamber 200, a first semiconductor film 105 is formed over the first insulating layer 104 (FIG. 1A).

The first semiconductor film 105 is preferably formed using a crystalline semiconductor, for example. In particular, as the crystalline semiconductor, it is preferable to use a microcrystalline semiconductor because the microcrystalline semiconductor can be formed without being subjected to a crystallization process such as a thermal crystallization process, a laser crystallization process, or the like.

Figure 1B:
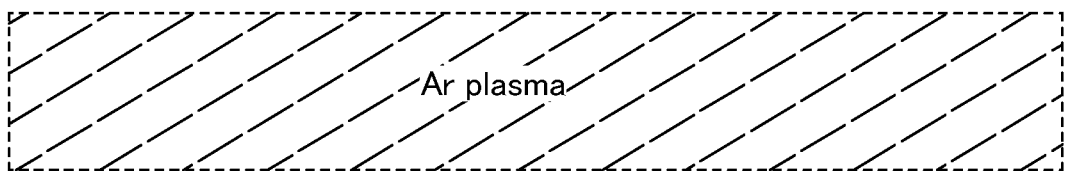

Next, the gases in the treatment chamber 200 are replaced and, the first semiconductor film 105 is exposed to Ar plasma, so that a first semiconductor film 106 is formed (FIG. 1B).

Here, plasma to be generated is not limited to Ar plasma and plasma treatment may be performed in an atmosphere that contains gas having low reactivity with the first semiconductor film 105 at high concentration. Here, the "gas having low reactivity with the semiconductor film" refers to gas which does not generate compounds over surfaces of the first semiconductor films 105 and 106 or in the first semiconductor films 105 and 106 even when the plasma treatment is performed on the first semiconductor film 105 and gas by which the first semiconductor films 105 and 106 are not easily etched. As an example of such a gas, a rare gas such as He, Ar, Ne, Kr, and Xe can be given. Ar is preferably used as the rare gas. This is because there is a large amount of Ar in the air, so that Ar is advantageous in cost.

Here, it is preferable that the amount of gas such as hydrogen by which a semiconductor film is etched be minimized in order to prevent a portion of the first semiconductor film 106 in which a rare gas element is contained from being etched.

Further, it is preferable that conditions of the treatment chamber 200 at the time of performing the plasma treatment be set to the same as the conditions (pressure, substrate temperature and the like) at the time of forming the first semiconductor film 105 and only the gases be replaced in the treatment chamber 200 in order to improve throughput.

Figure 1C:
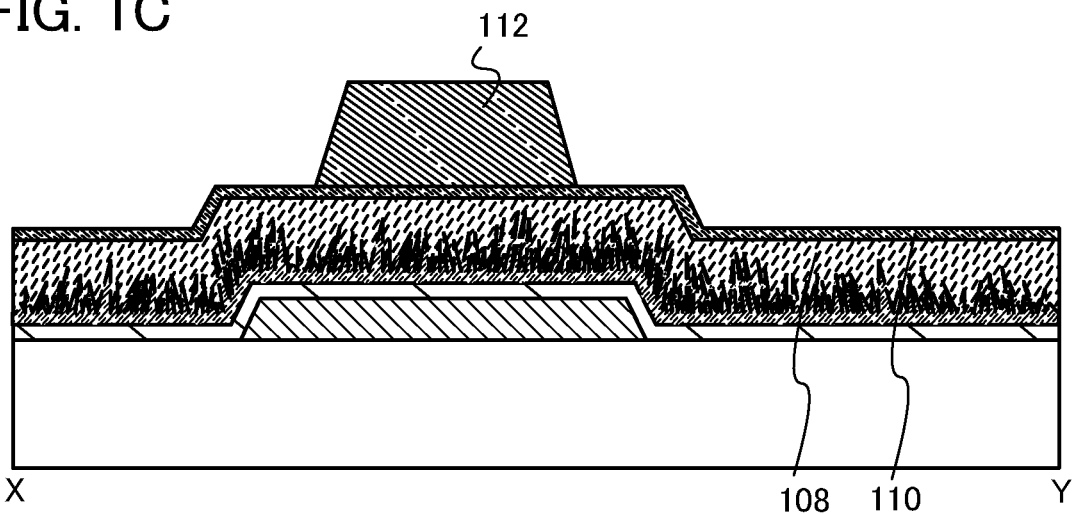

Next, a second semiconductor film 108 and an impurity semiconductor film 110 are formed over the first semiconductor film 106 (FIG. 1C).

The second semiconductor film 108 functions as a buffer film. The second semiconductor film 108 may be formed using a semiconductor having lower mobility than at least the first semiconductor film 106. By forming the second semiconductor film 108 over the first semiconductor film 106, off current can be reduced.

The second semiconductor film 108 preferably has an amorphous structure and a minute crystal grain and has lower energy at an urbach edge measured by a constant photocurrent method (CPM) or photoluminescence spectroscopy and a smaller amount of absorption spectra of defects, compared with a conventional amorphous semiconductor film. That is, it is preferable that the second semiconductor film 108 be a well-ordered semiconductor film which has fewer defects and whose tail of a level at a band edge in the valence band is steep, compared with the conventional amorphous semiconductor film. Here, a peak region of spectrum measured by low temperature photoluminescence spectroscopy of the second semiconductor film 108 is greater than or equal to 1.31 eV and less than or equal to 1.39 eV. Note that a peak region of spectrum measured by low temperature photoluminescence spectroscopy of the microcrystalline silicon film is greater than or equal to 0.98 eV and less than or equal to 1.02 eV.

Note that the second semiconductor film 108 may be formed using an amorphous semiconductor which does not contain a minute crystal grain.

The second semiconductor film 108 preferably contains an "impurity which suppresses generation of crystal nuclei" and as examples of the "impurity which suppresses generation of crystal nuclei," nitrogen, an NH group, or an $NH_2$ group can be given. When the second semiconductor film 108 contains an NH group, dangling bonds can be cross-linked, or when the second semiconductor film 108 contains an $NH_2$ group, dangling bonds can be terminated. When the second semiconductor film 108 contains an NH group or an $NH_2$ group, on current can be increased. Note that an $NH_3$ gas may be contained in a gas used for forming the second semiconductor film 108 so that an NH group or an $NH_2$ group is contained in the semiconductor film 108.

The impurity semiconductor film 110 is formed using a semiconductor in which an impurity element imparting one conductivity type is contained. In the case where the TFT is an n-channel TFT, for example, silicon to which P or As is added is used as the impurity element imparting one conductivity type. In the case where the TFT is a p-channel TFT, for example, B is used as the impurity element imparting one conductivity type. Note that it is preferable that the TFT be an n-channel TFT. Therefore, silicon to which P is added is used here. Note that the impurity semiconductor film 110 is preferably formed using a crystalline semiconductor such as a microcrystalline semiconductor. When the impurity semiconductor film 110 is formed using a crystalline semiconductor, on current is increased. Impurity elements which serve as donors or acceptors may be added to a source gas at the time of forming the impurity semiconductor film 110 or after forming the semiconductor film which does not include an impurity. Note that the impurity semiconductor film 110 forms at least a source region and a drain region.

Next, a resist mask 112 is selectively formed over the impurity semiconductor film 110 (FIG. 1C).

The resist mask 112 can be selectively formed by using a photolithography method after a resist material is applied.

Figure 2A:
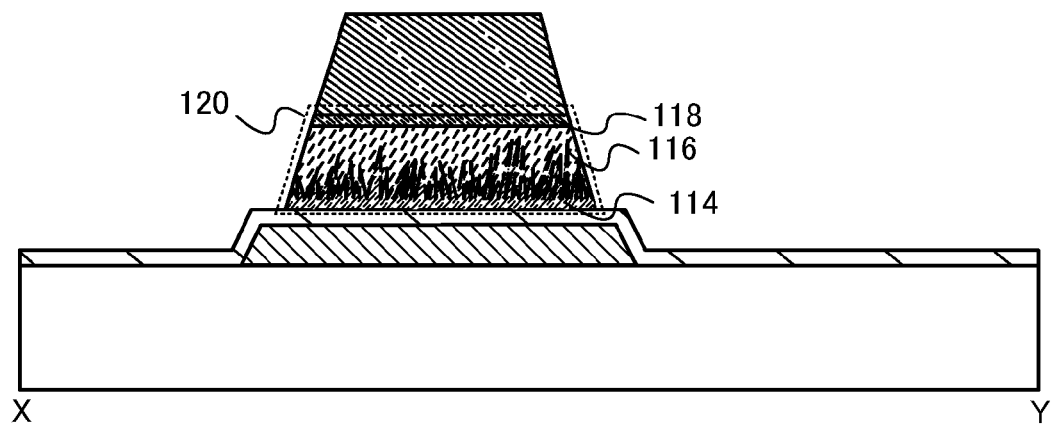
FIGS. 2A to 2C illustrate a method for manufacturing a TFT according to one embodiment of the present invention.

Next, the first semiconductor film 106, the second semiconductor film 108 and the impurity semiconductor film 110 are etched into an island shape with the use of the resist mask 112, so that a semiconductor stack 120 which is provided by stacking a first semiconductor layer 114, a second semiconductor layer 116 and an impurity semiconductor layer 118 is formed (FIG. 2A).

Figure 2B:
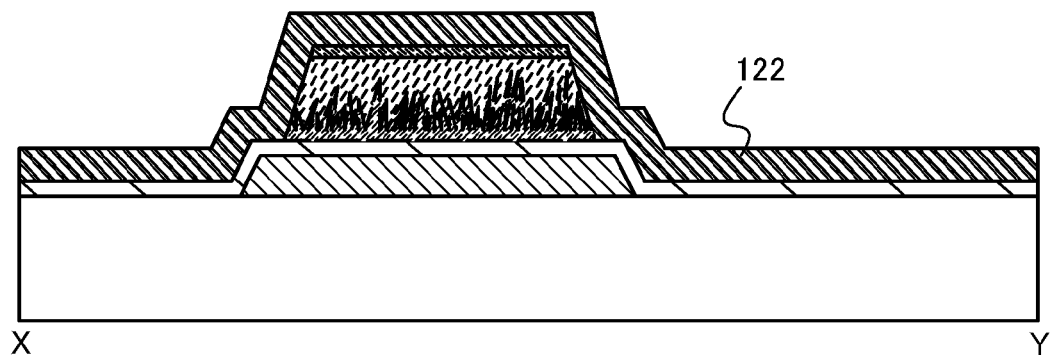

Next, a conductive film 122 is formed so as to cover the semiconductor stack 120 (FIG. 2B).

The conductive film 122 may be formed using the conductive material film.

Figure 2C:
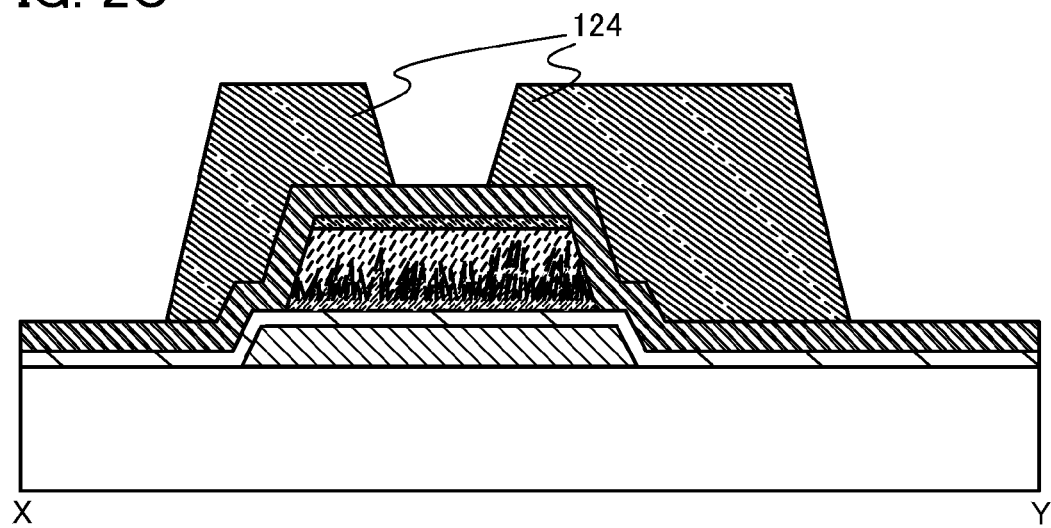

Next, a resist mask 124 is selectively formed on the conductive film 122 (FIG. 2C).

The resist mask 124 can be selectively formed by using a photolithography method after a resist material is applied.

Figure 3A:
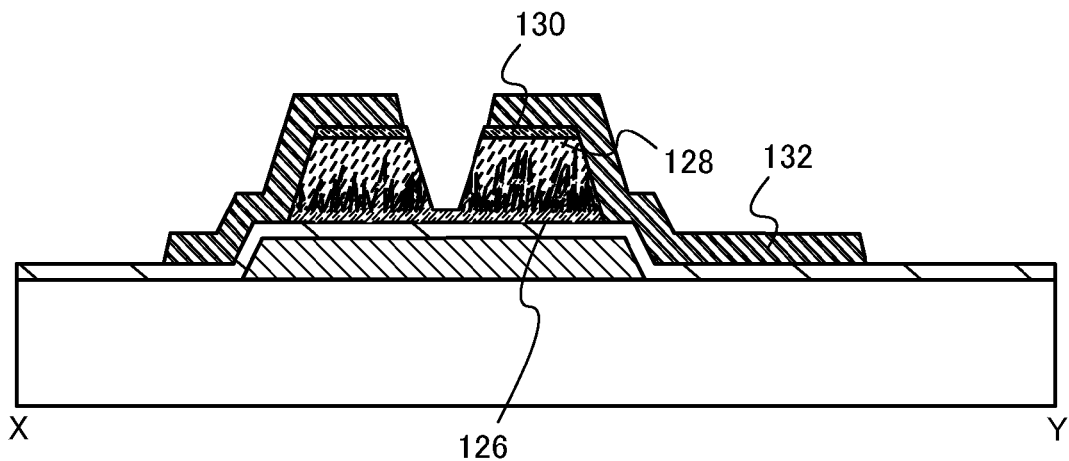
FIGS. 3A to 3C illustrate a method for manufacturing a TFT according to one embodiment of the present invention.

Next, the first semiconductor layer 114, the second semiconductor layer 116, the impurity semiconductor layer 118, and the conductive film 122 are etched with the use of the resist mask 124, so that a first semiconductor layer 126, a second semiconductor layer 128, an impurity semiconductor layer 130 and a second conductive layer 132 are formed (FIG. 3A). Note that an etching process for the first semiconductor layer 114, the second semiconductor layer 116 and the impurity semiconductor layer 118 and a process for etching the conductive film 122 may be different processes.

The second conductive layer 132 functions at least as a source electrode and a drain electrode.

As described above, a TFT which is one embodiment of the present invention can be manufactured (FIG. 3A).

The TFT illustrated in FIG. 3A includes: a gate electrode formed using the first conductive layer 102 which is formed over the substrate 100; a gate insulating layer formed using the first insulating layer 104 formed so as to cover the first conductive layer 102; a first semiconductor layer 126 formed over the first insulating layer 104; the second semiconductor layer 128 formed over the first semiconductor layer 126; the impurity semiconductor layer 130 formed over the second semiconductor layer 128; and a source electrode and a drain electrode formed using the second conductive layer 132 which is formed at least in contact with the impurity semiconductor layer 130. The first semiconductor layer 126 contains a gas having low reactivity with the first semiconductor layer 126.

Here, the gas having low reactivity with the first semiconductor layer 126 refers to gas which does not generate compounds over a surface of the first semiconductor layer 126 or in the first semiconductor layer 126 even when the plasma treatment is performed on the first semiconductor layer 126 and gas by which the first semiconductor layer 126 is not easily etched.

In the TFT having the above structure which is one embodiment of the present invention, rare gas may be used as the gas having low reactivity. As described above, Ar is preferably used as the rare gas.

Further, in the TFT having the above structure which is one embodiment of the present invention, it is preferable that concentration of a rare gas element contained in the first semiconductor layer 126 be greater than or equal to $2.5 \times 10^{18}$ cm$^{-3}$ and less than or equal to $4.5 \times 10^{19}$ cm$^{-3}$. This is because threshold voltage of the TFT can be adjusted effectively. Note that the concentration of the rare gas element is not limited to the above range, and the first semiconductor layer 126 may further contain rare gas.

Figure 3B:
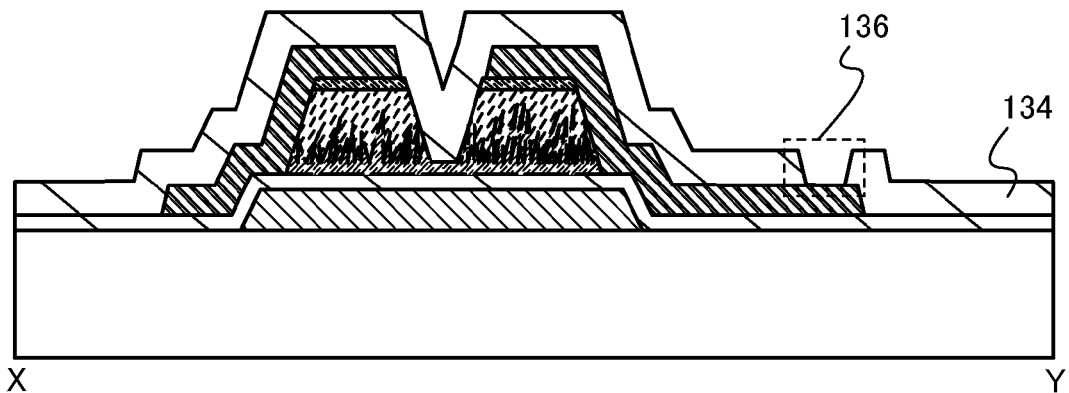

An second insulating layer 134 having an opening 136 is formed over the second conductive layer 132 so as to cover at least the first semiconductor layer 126, the second semiconductor layer 128, and the impurity semiconductor layer 130 (FIG. 3B).

The second insulating layer 134 may be formed in such a manner that an insulating film is formed, and the opening 136 is formed in the insulating film by a photolithography method.

The second insulating layer 134 functions as a protective insulating layer of the TFT. The second insulating layer 134 may be formed using an insulating material. As the insulating material, silicon oxide, silicon oxynitride, silicon nitride oxide, or silicon nitride can be given, for example.

Note that although it is not illustrated, an insulating layer which is formed using an organic resin material by a spin courting method or the like may be provided over the second insulating layer 134.

Figure 3C:
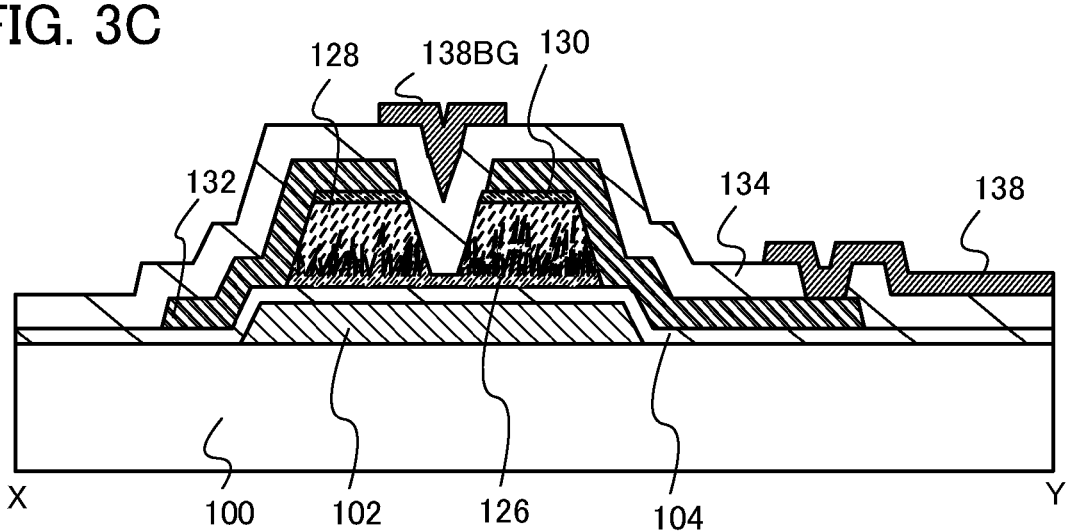

Next, a third conductive layer 138 is formed over the second insulating layer 134 (FIG. 3C). The third conductive layer 138 functions as either or both a pixel electrode and a back gate electrode.

The third conductive layer 138 can be formed using a conductive composition containing a conductive high molecule (also referred to as a conductive polymer) having a light-transmitting property. It is preferable that the third conductive layer 138 formed using the conductive composition have a sheet resistance of less than or equal to 10000 Ω/square and a light transmittance of greater than or equal to 70% at a wavelength of 550 nm. Note that the resistivity of the conductive high molecule included in the conductive composition is preferably less than or equal to 0.1 Ω·cm.

As the conductive high molecule, a so-called π electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The third conductive layer 138 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The third conductive layer 138 may be formed by processing a film that is formed using the above-described material by a photolithography method.

As described above, a pixel TFT (a pixel transistor) which is one embodiment of the present invention can be manufactured (FIG. 3C)

Note that the manufacturing method of the pixel TFT which is one embodiment of the present invention is not limited thereto, and, for example, a resist mask used for etching a semiconductor film and a resist mask used for etching a conductive film provided over the semiconductor film may be formed using a multi-tone mask (a half-tone mask or a gray-tone mask).

In the pixel TFT shown in FIG. 3C, the second insulating layer 134 having the opening 136 is provided so as to over the TFT shown in FIG. 3A, and the third conductive layer 138 is formed over the second insulating layer 134 so that connection is obtained through the opening 136.

Note that a back gate electrode 138BG is formed using the third conductive layer 138 over a region which is overlapped at least with a channel formation region of the first semiconductor layer 126. In addition to a channel formation region formed below (the substrate 100 side) the first semiconductor layer 126 using the first conductive layer 102, a channel formation region can be formed above (the back gate electrode 138BG side) the first semiconductor layer 126 using the back gate electrode 138BG; accordingly, the field-effect mobility can be improved and on current can be increased.

Note that the back gate electrode 138BG formed using the third conductive layer 138 may have an equal potential to the gate electrode formed using the first conductive layer 102, or may have a different potential from the gate electrode formed using the first conductive layer 102 by independently forming a wiring connected to the back gate electrode 138BG.

Note that the pixel TFT which is one embodiment of the present invention is not limited to the mode illustrated in FIG. 3C, and the back gate electrode 138BG which is formed using the third conductive layer 138 is not necessarily formed.

The pixel TFT shown in FIG. 3C can be applied to an array substrate of a display device.

A liquid crystal display device is manufactured by processing the above-described active-matrix substrate in a cell process and a module process. An example of the cell process and the module process will be described below.

In the cell process, an active matrix substrate having the pixel TFT manufactured in the above-described process and a substrate opposite to the active matrix substrate (hereinafter referred to as a counter substrate) are attached to each other and liquid crystal is injected. First, a method for manufacturing the counter substrate will be briefly described below.

First, a light-blocking layer is formed over a light-transmitting substrate; a color filter layer of any of red, green, and blue is formed over the light-blocking layer; a counter electrode layer is formed over the color filter layer; and then, a rib is formed over the counter electrode layer.

The light-blocking layer is selectively formed using a material having a light-blocking property. As the material having a light-blocking property, for example, an organic resin containing a black resin (carbon black) or a material containing chromium as its main component (chromium, chromium oxide, or chromium nitride) can be used. In order to selectively form the film of a material having a light-blocking property, a photolithography method or the like may be employed.

The color filter layer may be selectively formed by selective formation of color materials using materials which can transmit only light with any of red, green, and blue when being irradiated with white light. The arrangement of the color filter may be a stripe arrangement, a delta arrangement, or a square arrangement.

The counter electrode layer over the counter substrate may be formed over an entire surface over the counter substrate, using a material and a method similar to those of the pixel electrode layer included in the active matrix substrate.

The rib over the counter electrode layer is provided in order to widen the viewing angle and is selectively formed using an organic resin material. The rib may be formed as appropriate, if necessary.

After the formation of the color filter layer and before the formation of the counter electrode layer, an overcoat layer may be formed. By formation of the overcoat layer, planarity of a surface on which the counter electrode layer is formed can be improved, and part of a material included in the color filter layer can be prevented from entering a liquid crystal material. For the overcoat layer, a thermosetting material containing acrylic resin or epoxy resin as a base is used.

Further, before or after formation of the rib, a post spacer (columnar spacer) may be formed as a spacer. In the case of using a bead spacer (spherical spacer), the post spacer is not necessarily be formed.

Next, an alignment film is formed on the active matrix substrate and the counter substrate. The alignment film is formed, for example, in such a manner that a polyimide resin or the like is melted in an organic solvent; this solution is applied by a printing method, a spin coating method, or the like; and then the organic solvent is removed and the substrate is baked. Rubbing treatment is preferably performed on the alignment film to align liquid crystal molecules with a certain pretilt angle. The rubbing treatment may be performed, for example, by rubbing the alignment film with a shaggy cloth of velvet or the like.

Then, the active matrix substrate and the counter substrate are attached with a sealant. In the case of using the bead spacer, the bead spacer may be dispersed in a desired region and then attachment may be performed.

Next, a liquid crystal material is injected in a space between the active matrix substrate and the counter substrate, which are attached to each other. After injection of the liquid crystal material, an inlet for injection is sealed with an ultraviolet curing resin or the like. Alternatively, after dropping a liquid crystal material on either one of the active matrix substrate and the counter substrate, these substrates may be attached to each other.

Next, a polarizing plate is attached to both surfaces of a liquid crystal cell, which is formed by attachment of the active matrix substrate and the counter substrate. Then, the cell process is finished.

Next, as the module process, a flexible printed circuit (FPC) is connected to an input terminal of a terminal portion. The FPC has a wiring formed using a conductive film over an organic resin film of polyimide or the like, and is connected to the input terminal through an anisotropic conductive paste (ACP). The ACP includes a paste serving as an adhesive and particles plated with gold or the like to have a conductive surface, which have a diameter of several tens of micrometers to several hundreds of micrometers. When the particles mixed in the paste are in contact with both the conductive layer over the input terminal and the conductive layer over the terminal connected to the wiring formed in the FPC, electric connection therebetween is achieved. Alternatively, after connection of the FPC, the polarizing plate may be attached to the active matrix substrate and the counter substrate.

In the above-described manner, a liquid crystal display device can be manufactured.

A liquid crystal exhibiting a blue phase may be used as the liquid crystal material. The blue phase is a kind of liquid crystal phase and appears just before phase transition from a cholesteric phase to an isotropic phase when the temperature of a cholesteric liquid crystal is increased. Since the blue phase is only generated within a narrow range of temperature, a liquid crystal composition containing a chiral agent at 5 wt % or more is used in order to improve the temperature range. The liquid crystal composition containing a liquid crystal material exhibiting a blue phase and a chiral agent has a short response time of 10 μsec to 100 μsec inclusive and is optically isotropic; therefore, alignment treatment is not necessary and viewing angle dependence is small.

In addition, the display device which is one embodiment of the present invention may be an EL display device. In the case where the display device which is one embodiment of the present invention is an EL display device, an EL layer may be formed over the third conductive layer 138 and an additional pixel electrode layer may be formed over the EL layer.

Since the third conductive layer 138 can serve as an anode, a material of the other pixel electrode layer serving as a cathode may be a material having a low work function (e.g., Ca, Al, MgAg, or AlLi) which can be a cathode.

The EL layer may be a single-layer layer or a stacked-layer film in which a plurality of layers is stacked. The EL layer includes at least a light-emitting layer. It is preferable that the light-emitting layer be connected to the other pixel electrode layer through a hole transport layer.

Note that the EL display device which is one embodiment of the present invention may be of a top emission type, a bottom emission type, or a dual emission type.

The TFT and the display device can be applied to a variety of electronic devices (including an amusement machine). Examples of the electronic devices include a television set (also referred to as a television or a television receiver), a monitor of a computer, electronic paper, a digital camera, a digital video camera, a digital photo frame, a cellular phone set (also referred to as a cellular phone or a cellular phone device), a portable game machine, a portable information terminal, an audio replay device, a large-sized game machine such as a pachinko machine, or the like.

The display device can be applied to electronic paper, for example. The electronic paper can be used for electronic devices of a variety of fields for displaying information. For example, an electronic paper can be used for electronic book devices (e-books), posters, advertisements in vehicles such as trains, display of image or information on a variety of cards such as credit cards, and the like.

Figure 7A:
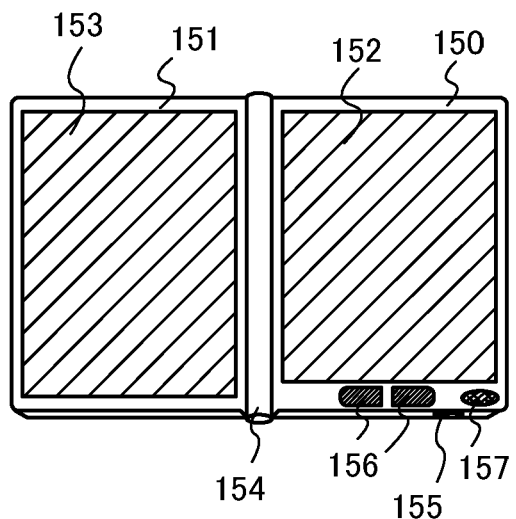
FIGS. 7A to 7D each illustrate an electronic device according to one embodiment of the present invention.

FIG. 7A illustrates an example of the electronic book device. The electronic device illustrated in FIG. 7A includes the housing 150 and the housing 151. The housing 150 and the housing 151 are combined with a hinge 154 so that the electronic book device can be opened and closed. With such a structure, the electronic book device can be handled like a paper book.

A display portion 152 and a display portion 153 are incorporated in the housing 150 and the housing 151, respectively. The display portion 152 and the display portion 153 may display one image or different images. With a structure in which different images are displayed, for example, text can be displayed on the display portion on the right side (the display portion 152 in FIG. 7A) while an image can be displayed on the display portion on the left side (the display portion 153 in FIG. 7A). The display device can be applied to the display portions 152 and 153.

In FIG. 7A, the housing 150 includes a power supply input terminal 155, operation keys 156, a speaker 157, and the like. The operation keys 156 may have a function of turning pages, for example. Note that a keyboard, a pointing device, or the like may also be provided on the same surface as the display portions of the housings 150 and 151. Furthermore, an external connection terminal (an earphone terminal, a USB terminal, a terminal that can be connected to various cables such as a USB cable, or the like), a recording medium insertion portion, and the like may be provided on the back surface or the side surface of the housings 150 and 151. Further, the electronic book reader illustrated in FIG. 7A may further has a structure capable of wirelessly transmitting and receiving data.

Figure 7B:
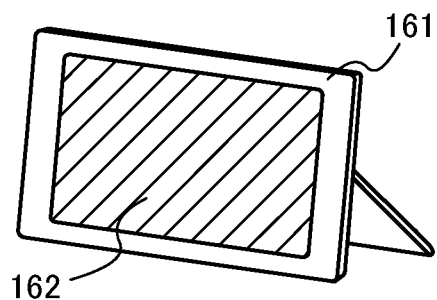

FIG. 7B illustrates an example of the digital photo frame. In the digital photo frame illustrated in FIG. 7B, a display portion 162 is incorporated in a housing 161. The display device can be applied to the display portion 162.

Note that the digital photo frame illustrated in FIG. 7B may be provided with an operation portion, an external connection terminal (a USB terminal, a terminal that can be connected to various cables such as a USB cable, or the like), a recording medium insertion portion, and the like. Although these components may be provided on the same surface as the display portion, it is preferable to provide them on the side surface or the back surface for the design of the digital photo frame. For example, a memory storing image data taken with a digital camera is inserted into the storage medium inserting portion of the digital photo frame and the image data is imported, whereby the imported image data can be displayed on the display portion 162. The digital photo frame illustrated in FIG. 7B may has a structure capable of wirelessly transmitting and receiving data.

Figure 7C:
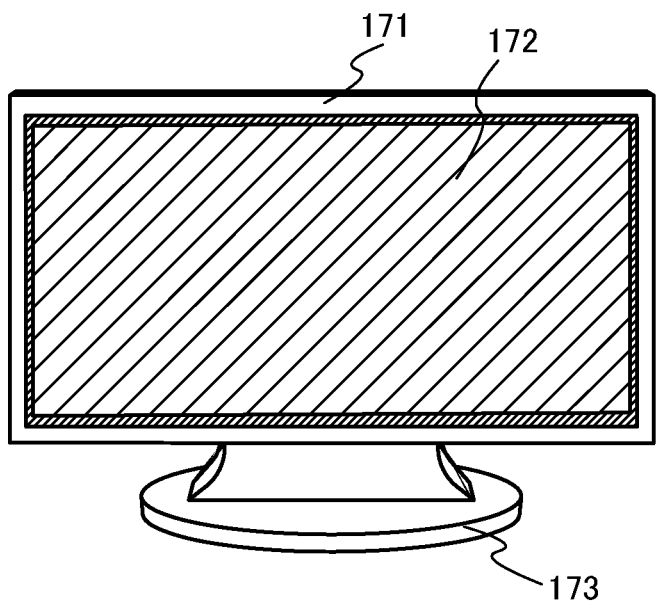

FIG. 7C illustrates an example of the television set. In the television set illustrated in FIG. 7C, a display portion 172 is incorporated in a housing 171, and the housing 171 is supported by a stand 173. The display device can be applied to the display portion 172.

The television set illustrated in FIG. 7C can be operated with an operation switch of the housing 171 or a separate remote controller. Channels and volume can be controlled by operation keys of the remote controller, so that images displayed on the display portion 172 can be selected. Further, the remote controller may be provided with a display portion for displaying data output from the remote controller.

Note that the television set illustrated in FIG. 7C is provided with a receiver, a modem, and the like. With the receiver, a general television broadcast can be received. Further, when the television device is connected to a communication network by wired or wireless connection via the modem, one-way (from a transmitter to a receiver) or two-way (between a transmitter and a receiver, between receivers, or the like) data communication can be performed.

Figure 7D:
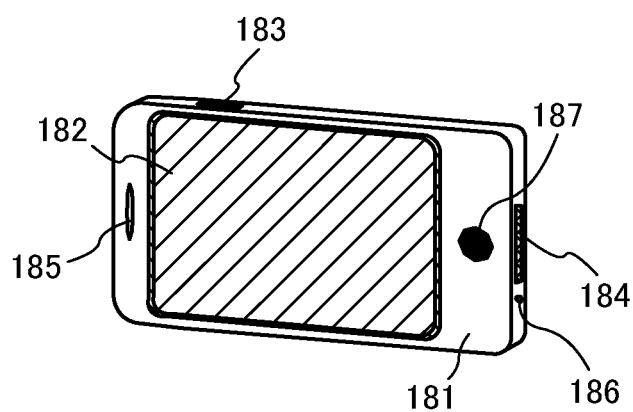
Figure 8A:
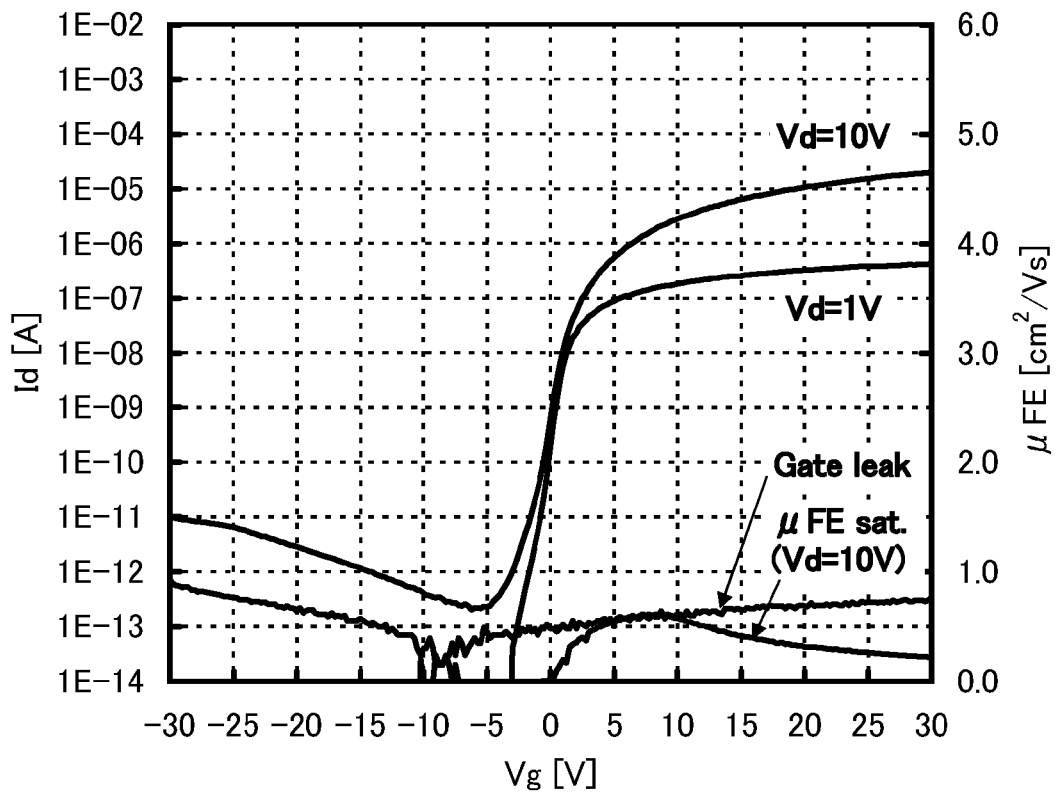
FIGS. 8A and 8B each show an I-V curve of a TFT (FIGS. 8A and 8B both show comparative examples)
Figure 8B:
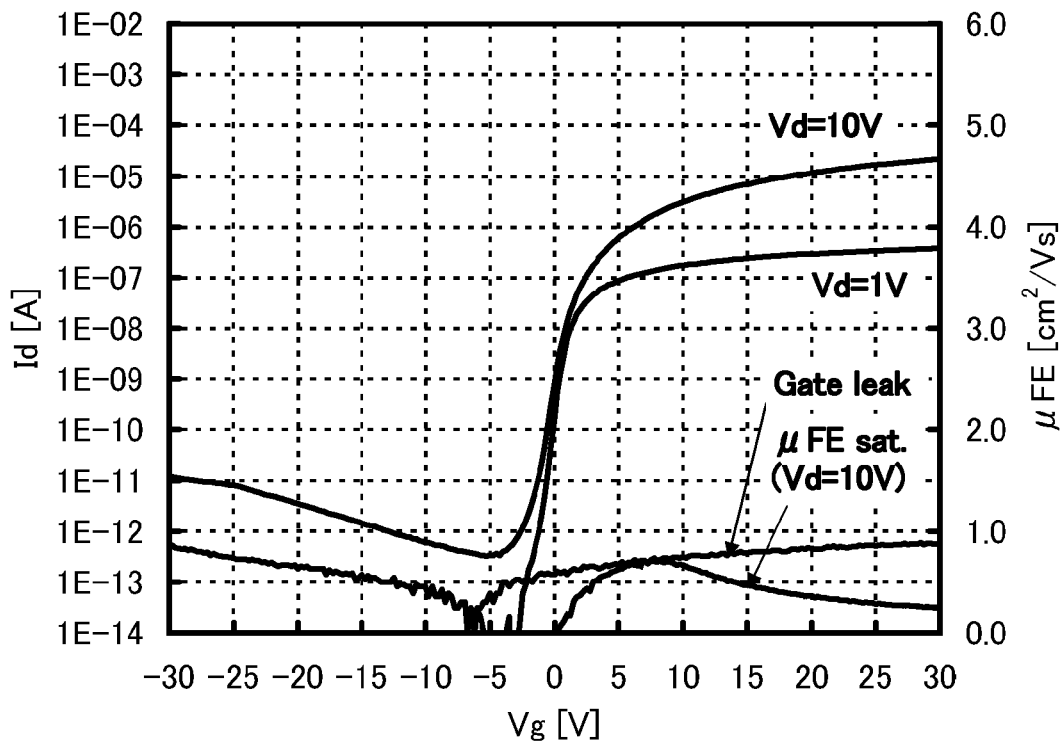
Figure 9A:
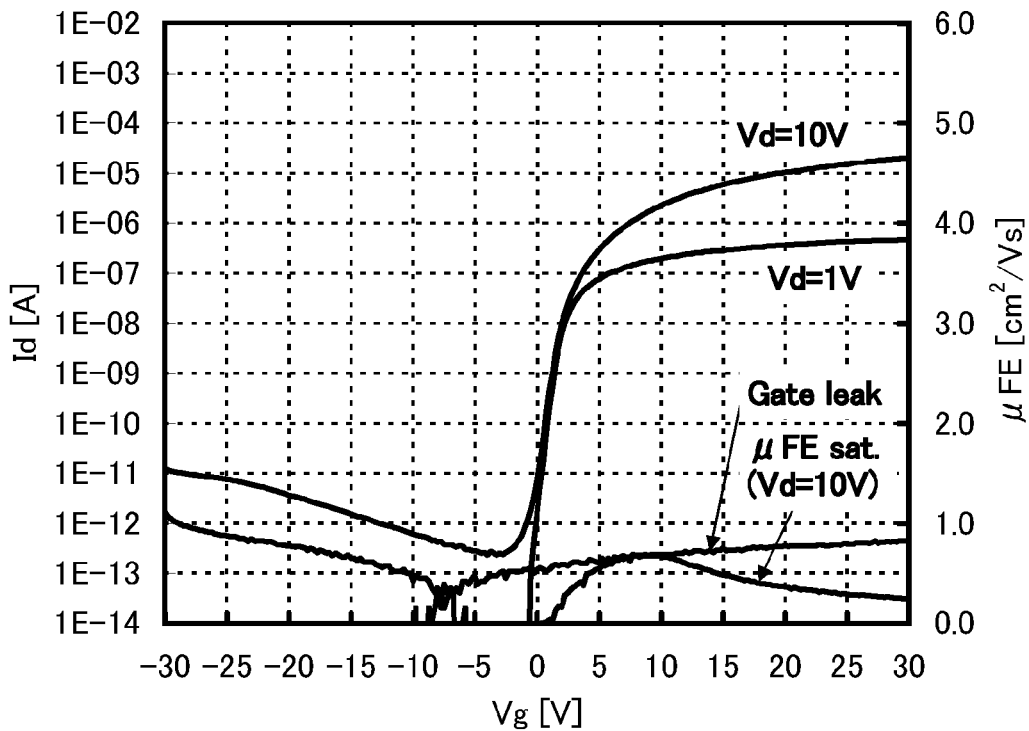
FIGS. 9A and 9B each show an I-V curve of a TFT (FIG. 9A shows a comparative example and FIG. 9B is an embodiment)
Figure 9B:
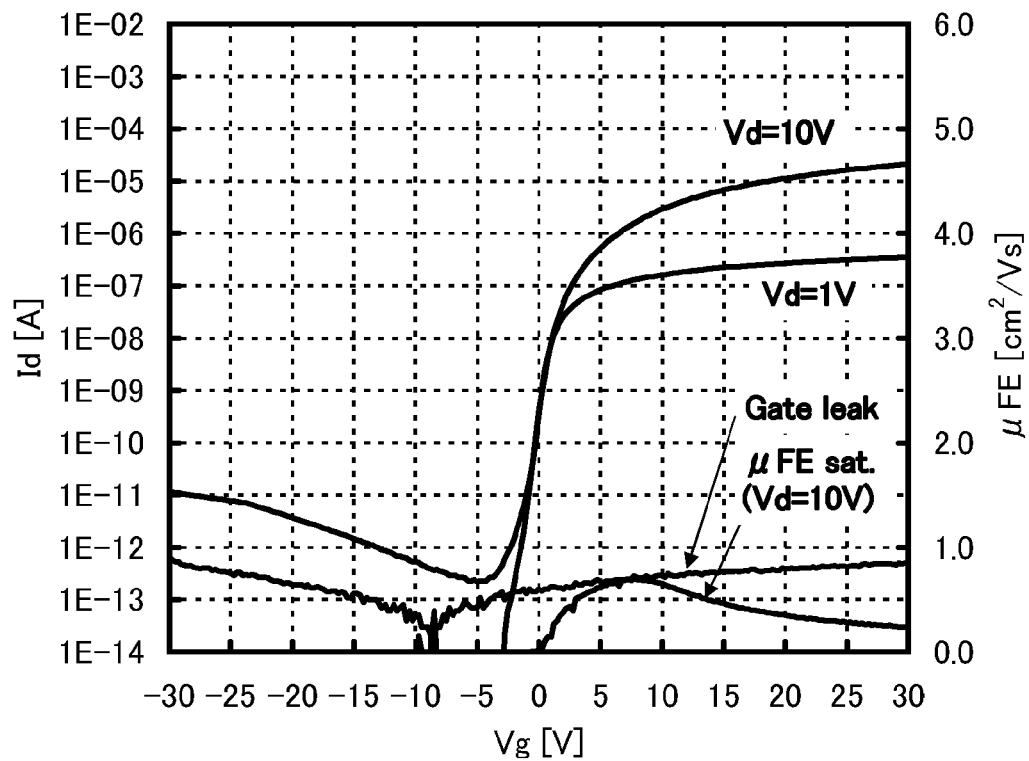

FIG. 7D illustrates an example of the cellular phone set. The cellular phone set illustrated in FIG. 7D is provided with a display portion 182 incorporated in a housing 181, operation buttons 183 and 187, an external connection port 184, a speaker 185, a microphone 186, and the like. The display device can be applied to the display portion 182.

The display portion 182 of the cellular phone set illustrated in FIG. 7D may be a touch panel. In the case where the display portion 182 is the touch panel, operations such as making calls and composing mails can be performed by using the display portion 182 as a touch panel.

There are mainly three screen modes for the display portion 182. The first mode is a display mode mainly for displaying images. The second mode is an input mode mainly for inputting data such as text. The third mode is a display-and-input mode in which two modes of the display mode and the input mode are combined.

For example, in the case of making calls or composing mails, a text input mode mainly for inputting text is selected for the display portion 182 and text input operation can be performed on the screen. In that case, it is preferable to display a keyboard or number buttons on a large area of the screen of the display portion 182.

When a detection device including a sensor for detecting inclination, such as a gyroscope or an acceleration sensor, is provided inside the cellular phone set illustrated in FIG. 7D, display data for the display portion 182 can be automatically switched according to the orientation of the cellular phone set (whether the cellular phone set is placed horizontally or vertically).

Further, the screen modes may be switched by touching the display portion 182 or operating the operation button 187 of the housing 181. Alternatively, the screen modes may be switched depending on the kinds of image displayed on the display portion 182.

In the input mode, when input by touching the display portion 182 is not performed for a specified period of time while a signal detected by an optical sensor in the display portion 182 is detected, the screen mode may be controlled so as to be switched from the input mode to the display mode.

The display portion 182 can also function as an image sensor. For example, when an image of a palm print, a fingerprint, or the like is taken by the image sensor by touching the display portion 182 with a palm or a finger, personal authentication can be performed. Further, by providing a backlight or a sensing light source emitting near-infrared light for the display portion, an image of a finger vein, a palm vein, or the like can be taken.

As described above, the TFT and the display device can be applied to a variety of electronic devices.

Example 1

In this example, the following TFTs are formed: a first TFT in which plasma treatment is not performed on a first semiconductor film; a second TFT in which $H_2$ plasma treatment is performed on a first semiconductor film; a third TFT in which Ar plasma treatment is performed on a first semiconductor film; and a fourth TFT in which plasma treatment using a mixture gas of $H_2$ and Ar is performed on a first semiconductor film. Then, electrical characteristics thereof are compared.

The second TFT to fourth TFT in this example are formed in the above manner described with reference to FIGS. 1A to 1C, FIGS. 2A to 2C, and FIGS. 3A to 3C and only the kind of plasma used in plasma treatment performed on the first semiconductor film are different from each other. The first TFT in this example is formed in the above manner described with reference to FIGS. 1A to 1C, FIGS. 2A to 2C, and FIGS. 3A to 3C, except for not performing plasma treatment on the first semiconductor film.

A base insulating film (not shown) was formed over the substrate 100, and the first conductive layer 102 was formed over the base insulating film.

A glass substrate (EAGLE XG manufactured by Corning Incorporated) was used as the substrate 100.

As the base insulating film, a silicon oxynitride film was formed with a thickness of 200 nm by a plasma CVD method.

The first conductive layer 102 had a structure in which an aluminum layer was interposed between titanium layers. Specifically, first, a first titanium film with a thickness of 50 nm was formed over the base insulating film by sputtering a titanium target with Ar ions. At this time, the flow rate of Ar gas which was introduced into a treatment chamber was 20 sccm and the pressure inside the treatment chamber was 0.1 Pa. Next, an aluminum film with a thickness of 100 nm was formed over the first titanium film by sputtering an aluminum target with Ar ions. At this time, the flow rate of Ar gas which was introduced into the treatment chamber was 50 sccm and the pressure inside the treatment chamber was 0.4 Pa. Then, a second titanium film with a thickness of 50 nm was formed over the aluminum film by sputtering a titanium target with Ar ions. At this time, the flow rate of Ar gas which was introduced into the treatment chamber was 20 sccm and the pressure inside the treatment chamber was 0.1 Pa.

Then, a resist was applied over the second titanium film and was irradiated with light with the use of a first photomask and developed to form a resist mask.

Next, etching treatment was performed using the resist mask, so that the first conductive layer 102 was formed. Here, a two-step etching was conducted using inductively coupled plasma (ICP) apparatus in the following manner. A first etching was performed under conditions where the ICP power was 600 W, the bias power was 250 W, boron trichloride gas was introduced at a flow rate of 60 sccm and chlorine gas was introduced at a flow rate of 20 sccm as an etching gas, and the pressure inside the treatment chamber was 1.2 Pa. After that, a second etching was performed under conditions where the ICP power was 500 W, the bias power was 50 W, fluorocarbon gas was introduced at a flow rate of 80 sccm as an etching gas, and the pressure inside the treatment chamber was 2.0 Pa. Then, the resist mask was removed.

Next, the first insulating layer 104 was formed over the base insulating film so as to cover the first conductive layer 102 (FIG. 1A).

As the first insulating layer 104, a silicon nitride film was formed with a thickness of 110 nm by a plasma CVD method, and a silicon oxide film was formed over the silicon nitride film with a thickness of 110 nm by a plasma CVD method.

Here, formation of the silicon nitride film by a plasma CVD method was performed under conditions where source gases of silane gas, ammonium gas, and Ar gas were introduced at flow rates of 5 sccm, 400 sccm, and 50 sccm, respectively, and stabilized, and plasma discharge was performed, at a pressure of the treatment chamber of 30 Pa, a temperature of the substrate of 280° C., an RF power source frequency of 27 MHz, and a power of the RF power source of 500 W.

Then, formation of the silicon oxide film by the plasma CVD method was performed in such a manner that tetraethoxysilane was formed over the silicon nitride film and oxygen plasma treatment was performed.

Next, as the first semiconductor film 105, a microcrystalline silicon film was formed over the first insulating layer 104.

Here, formation of the microcrystalline silicon film was performed by the plasma CVD method under conditions where source gases of silane gas, ammonium gas, and Ar gas were introduced at flow rates of 4 sccm, 750 sccm and 750 sccm, respectively, and stabilized, and plasma discharge was performed, at a pressure inside the treatment chamber of 1237 Pa, an RF power source frequency of 13.56 MHz, and a power of the RF power source of 125 W. Note that the formation of the microcrystalline semiconductor film was performed using a parallel plate plasma treatment apparatus under conditions where the distance between an upper electrode and a lower electrode was 7 mm, the temperature of the upper electrode was 200° C., the temperature of the lower electrode was 300° C., and the temperature of the substrate was 285° C.

Here, an apparatus illustrated in FIG. 4 was used in the formation of the microcrystalline silicon film and plasma treatment described below.

Here, $H_2$ plasma treatment was performed on the first semiconductor film 105 formed in the second TFT. The plasma treatment was performed in the same treatment chamber as the step for forming the first semiconductor film 105. The plasma treatment was performed under conditions where the $H_2$ gas was introduced at a flow rate of 750 sccm, and stabilized, a pressure inside the treatment chamber was 1237 Pa, an RF power source frequency was 13.56 MHz, a power of the RF power source was 125 W, the temperature of the upper electrode was 200° C., the temperature of the lower electrode was 300° C., and the temperature of the substrate was 285° C.

Ar plasma treatment was performed on the first semiconductor film 105 formed in the third TFT. The plasma treatment was performed in the same treatment chamber as the step for forming the first semiconductor film 105. The plasma treatment was performed under conditions where the Ar gas was introduced at a flow rate of 750 sccm, and stabilized, a pressure of the treatment chamber was 1237 Pa, an RF power source frequency was 13.56 MHz, a power of the RF power source was 125 W, the temperature of the upper electrode was 200° C., the temperature of the lower electrode was 300° C., and the temperature of the substrate was 285° C.

Further, plasma treatment using a mixture gas of $H_2$ and Ar is performed on the first semiconductor film 105 formed in the fourth TFT. The plasma treatment was performed in the same treatment chamber as the step for forming the first semiconductor film 105. The plasma treatment was performed under conditions that the mixture gas of $H_2$ and Ar was introduced at a flow rate of 750 sccm and 750 sccm, respectively, and stabilized, the pressure inside the treatment chamber was 1237 Pa, the RF power source frequency was 13.56 MHz, the power of the RF power source was 125 W, the temperature of the upper electrode was 200° C., the temperature of the lower electrode was 300° C., and the temperature of the substrate was 285° C.

Next, the second semiconductor film 108 was formed over the first semiconductor film 106 and the impurity semiconductor film 110 was formed over the second semiconductor film 108. As the second semiconductor film 108, a silicon film was formed with a thickness of 175 nm by a plasma CVD method. As the impurity semiconductor film 110, an amorphous silicon film containing P was formed with a thickness of 50 nm by a plasma CVD method.

Formation of the second semiconductor film 108 was performed under conditions where source gases of silane gas, 1000 ppm ammonium gas (diluted with $H_2$ gas), $H_2$ gas, Ar gas were introduced at flow rates of were 40 sccm, 100 sccm, 650 sccm, and 750 sccm, respectively, and stabilized, and plasma discharge was performed at a pressure of the treatment chamber of 1237 Pa, the RF power source frequency of 13.56 MHz, and the power of the RF power source of 200 W. Note that a plasma CVD method was performed under conditions where a parallel plate was used, the temperature of the upper electrode was 200° C., the temperature of the lower electrode was 300° C., and the temperature of the substrate was 285° C.

Formation of the impurity semiconductor film 110 was performed under conditions where source gases of silane gas, 5% phosphine gas (diluted with silane gas), $H_2$ gas were introduced at flow rates of, were 90 sccm, 10 sccm and 100 sccm, respectively, and stabilized, and the pressure inside the treatment chamber was 60 Pa, the RF power source frequency was 13.56 MHz, the power of the RF power source was 30 W, and the temperature of the substrate was 250° C.

Next, a resist was applied over the impurity semiconductor film 110 and was irradiated with light with the use of a second photomask and developed to form the resist mask 112.

Next, the first semiconductor film 106, the second semiconductor film 108, and the impurity semiconductor film 110 were etched with the use of the resist mask 112, so that the semiconductor stack 120 including the first semiconductor layer 114, the second semiconductor layer 116, and the impurity semiconductor layer 118 was formed.

The etching for forming the semiconductor stack 120 was conducted by using an ICP apparatus under conditions where the source power was 1000 W, the bias power was 80 W, chlorine gas was introduced at a flow rate of 100 sccm as an etching gas, and the pressure inside the treatment chamber was 1.51 Pa. After that, the resist mask 112 was removed.

Next, the conductive film 122 was formed over the first insulating layer 104 so as to cover the semiconductor stack 120.

Here, the conductive film 122 had a structure in which an aluminum layer was interposed between titanium layers and was formed in a manner similar to that of the first conductive layer 102. Note that the thicknesses of the first titanium film, the aluminum film, and the second titanium film were 50 nm, 200 nm, and 50 nm, respectively.

Next, a resist was applied over the conductive film 122 and was irradiated with light with the use of a third photomask and developed to form a resist mask 124. Dry etching was performed on the conductive film 122 with the use of the resist mask 124, so that the second conductive layer 132 was formed. Then, the impurity semiconductor layer 118 was dry etched so that the impurity semiconductor layer 130 which functions as a source region and a drain region was formed. Further, the first semiconductor layer 114 and the second semiconductor layer 116 were etched so that the first semiconductor layer 126 and the second semiconductor layer 128 were formed.

Here, the dry etching was conducted using an ICP apparatus under conditions where the ICP power was 450 W, the bias power was 100 W, boron chloride gas and chlorine gas were introduced at flow rates of 60 sccm and 20 sccm, respectively as an etching gas, and the pressure inside the treatment chamber was 1.9 Pa.

Note that the etching of the first semiconductor layer 114, the second semiconductor layer 116 and the impurity semiconductor layer 118 was performed to a depth of 80 nm from an interface between the conductive film 122 and the impurity semiconductor layer 118.

Note that although not illustrated, the top surface shape of the second conductive layer 132 which functions as a source electrode and a drain electrode was linear and the source electrode and the drain electrode were provided in parallel so as to oppose each other.

Next, plasma treatment was performed on an exposed portion of the first semiconductor layer 126 and the second semiconductor layer 128. The plasma treatment was performed using fluorocarbon gas, so that residue on the surface of the exposed portion of the first semiconductor layer 126 and the second semiconductor layer 128 was removed. The plasma treatment was performed using the ICP apparatus under conditions where the source power is 1000 W, the bias power is 0 W, fluorocarbon gas was introduced at a flow rate of 100 sccm, and the pressure inside the treatment chamber was 0.67 Pa. After that, the resist mask 124 was removed (FIG. 3A).

Next, as an insulating film which is to be processed into the second insulating layer 134, a silicon nitride film was formed with a thickness of 300 nm. Formation of the silicon nitride film was performed under conditions where source gases of silane gas, ammonium gas, and nitrogen gas were introduced at flow rates of were 5 sccm, 400 sccm, 50 sccm, respectively, and stabilized, and plasma discharge was performed at a pressure inside the treatment chamber of 30 Pa, an RF power source frequency of 27 MHz, and a power of the RF power source of 500 W.

Next, a resist was applied over the insulating film which is to be processed into the second insulating layer 134 and was irradiated with light with the use of a fourth photomask and developed to form a resist mask. The insulating film which is to be processed into the second insulating layer 134 was partly etched by dry etching with the use of the resist mask, so that the second conductive layer 132 functioning as the source electrode and the drain electrode was partly exposed. Note that although not illustrated, a desired region of both the first insulating layer 104 and the second insulating layer 134 was etched by dry etching, so that the first conductive layer 102 was partly exposed. After that the resist mask was removed.

Electrical characteristics of the first TFT to the fourth TFT formed in the above-described manner were measured and I-V curves were obtained. Results thereof are shown in FIGS. 8A and 8B and FIGS. 9A to 9B.

FIG. 8A, FIG. 8B, FIG. 9A, and FIG. 9B show the I-V curves obtained from the first TFT, the second TFT, the third TFT, and the fourth TFT, respectively.

Threshold voltages of the first TFT, the second TFT, the third TFT, and the fourth TFT are 1.2±0.25 V, 1.39±0.21 V, 2.37±0.40 V, and 1.36±0.21 V, respectively. Therefore, the threshold voltage of the third TFT is the highest.

When the threshold voltages of the first TFT to the fourth TFT are compared to each other, although the effect of shifting the threshold voltage to a positive side is small in the case where $H_2$ plasma or a mixture gas plasma of $H_2$ gas and Ar gas is used in the plasma treatment on the first semiconductor film, the threshold voltage can be greatly shifted to the positive side in the case where Ar plasma is used in the plasma treatment on the first semiconductor film.

In the fourth TFT, shift of the threshold voltage to the positive side is small. It is considered that this is because in the case where the mixture gas plasma of $H_2$ gas and Ar gas was used, even when Ar gas was contained in the first semiconductor film, the first semiconductor film containing Ar gas was etched by $H_2$ gas and Ar finally remaining in the first semiconductor film was little. Since SIMS is a destructive analysis, a plurality of the first TFT, which includes the first semiconductor film 106 and the second semiconductor film 108, and the third TFT, which includes the first semiconductor film 106 and the second semiconductor film 108, was formed and part thereof was used for the analysis by SIMS.

Figure 10:
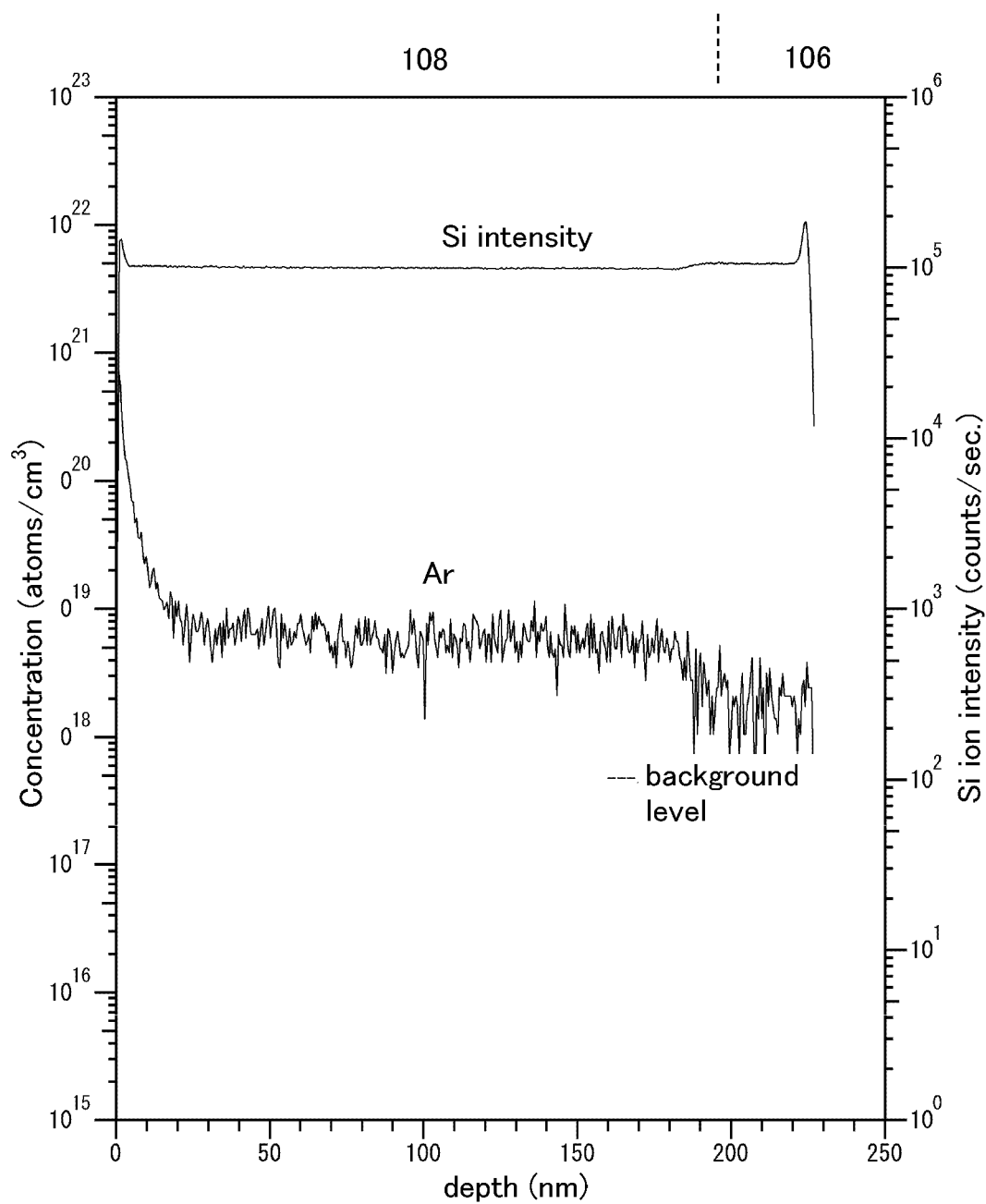
FIG. 10 shows results of SIMS analysis of a semiconductor film (a comparative example)
Figure 11:
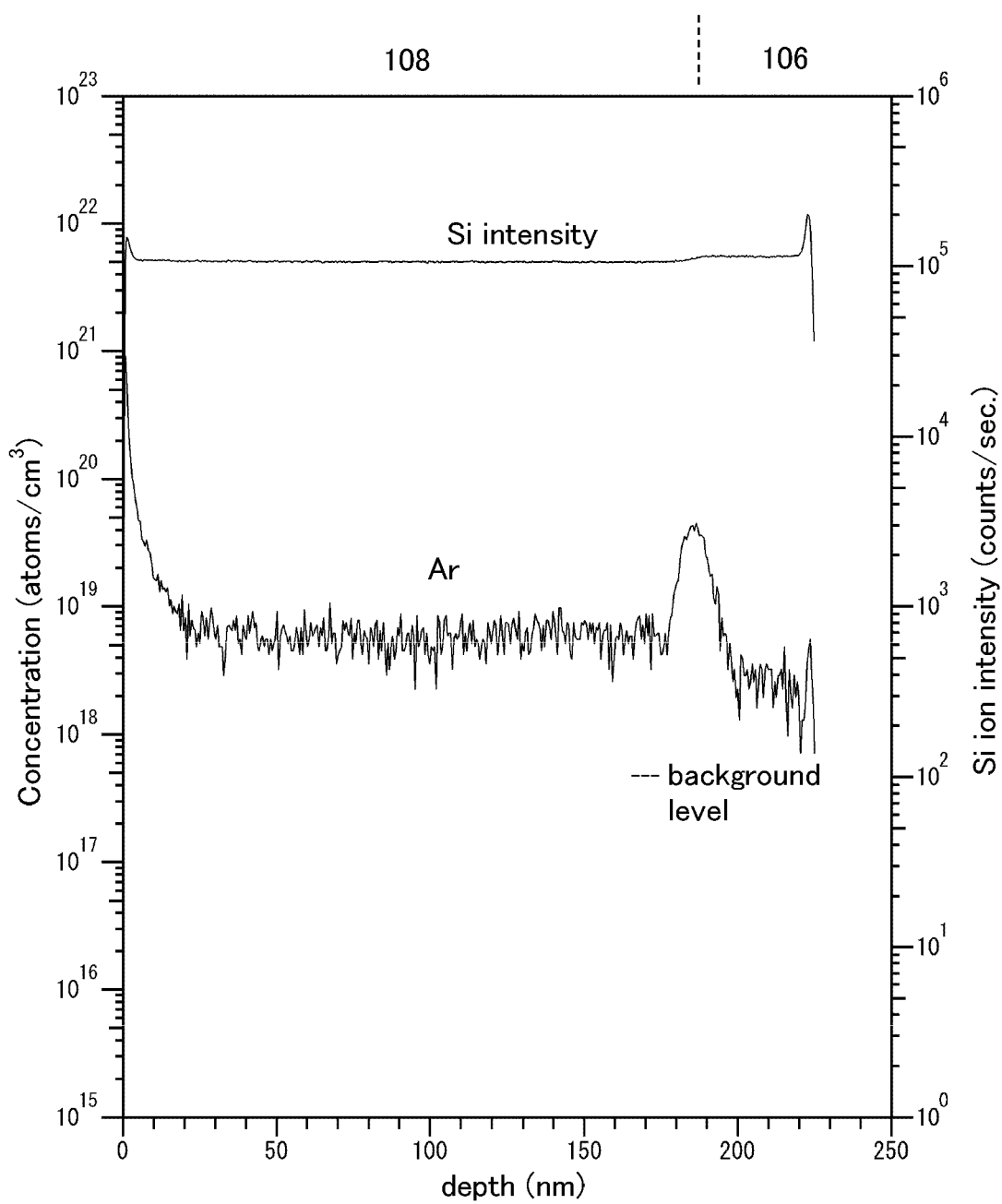
FIG. 11 shows results of SIMS analysis of a semiconductor film.

In FIG. 10 and FIG. 11, results of SIMS analysis of the first semiconductor films 106 and the second semiconductor films 108 which were formed in a manner similar to the first TFT and the third TFT whose I-V curves were obtained are shown.

FIG. 10 shows results of SIMS analysis of the first semiconductor film 106 and the second semiconductor film 108 which were in the first TFT. FIG. 11 shows results of SIMS analysis of the first semiconductor film 106 and the second semiconductor film 108 which were in the third TFT.

When the results of the SIMS analyses shown in FIG. 10 and FIG. 11 are compared to each other, the result of the SIMS analysis shown in FIG. 11 has a peak attributed to Ar in the vicinity of an interface between the first semiconductor film 106 and the second semiconductor film 108. According to the peak, it is found that in the first semiconductor film 106 provided in the third TFT, Ar is contained at a concentration within a range of $2.5 \times 10^{18}$ cm$^{-3}$ to $4.5 \times 10^{19}$ cm$^{-3}$. Note that Ar may be contained greater than the above concentration range.

As described in this example, Ar can be contained in the first semiconductor film 106 at a concentration within the range of $2.5 \times 10^{18}$ cm$^{-3}$ to $4.5 \times 10^{19}$ cm$^{-3}$ by performing Ar plasma treatment on the first semiconductor film 106. By manufacturing TFTs in this manner, threshold voltage shifts to the positive side; accordingly, favorable switching characteristics of the TFTs can be obtained.

This application is based on Japanese Patent Application serial no. 2010-048817 filed with Japan Patent Office on Mar. 5, 2010, the entire contents of which are hereby incorporated by reference.

What is claimed is:

1. A method for manufacturing a semiconductor device, comprising the steps of:
    introducing a semiconductor material gas into a treatment chamber;
    forming a first semiconductor film in the treatment chamber over a gate insulating layer provided to cover a gate electrode;
    evacuating the semiconductor material gas from the treatment chamber;
    introducing a rare gas into the treatment chamber;
    performing plasma treatment on the first semiconductor film in the treatment chamber;
    forming a second semiconductor film over the plasma treated first semiconductor film;
    forming a third semiconductor film comprising a first impurity element imparting one conductivity type over the second semiconductor film;
    forming a semiconductor stack including the treated first semiconductor film, the second semiconductor film and the third semiconductor film; and
    forming a source electrode and a drain electrode in contact with the third semiconductor film,
    wherein formation of the first semiconductor film and the plasma treatment are performed without change in pressure and temperature of the treatment chamber.

2. The method for manufacturing the semiconductor device according to claim 1, wherein the rare gas is argon gas.

3. The method for manufacturing the semiconductor device according to claim 1, wherein the first semiconductor film comprises a crystalline semiconductor.

4. The method for manufacturing the semiconductor device according to claim 1, wherein the first semiconductor film comprises a microcrystalline semiconductor.

5. The method for manufacturing the semiconductor device according to claim 1, wherein the second semiconductor film has an amorphous structure and a minute crystal grain.

6. A method for manufacturing a semiconductor device, comprising the steps of:
    introducing a semiconductor material gas into a treatment chamber;
    forming a first semiconductor film in the treatment chamber over a gate insulating layer provided to cover a gate electrode;
    evacuating the semiconductor material gas from the treatment chamber;
    introducing a rare gas into the treatment chamber;
    performing plasma treatment on the first semiconductor film in the treatment chamber;
    forming a second semiconductor film over the plasma treated first semiconductor film;
    forming a third semiconductor film comprising a first impurity element imparting one conductivity type over the second semiconductor film;
    forming a semiconductor stack including the treated first semiconductor film, the second semiconductor film and the third semiconductor film; and
    forming a source electrode and a drain electrode in contact with the third semiconductor film.

7. The method for manufacturing the semiconductor device according to claim 6, wherein the rare gas is argon gas.

8. The method for manufacturing the semiconductor device according to claim 6, wherein the first semiconductor film comprises a crystalline semiconductor.

9. The method for manufacturing the semiconductor device according to claim 6, wherein the first semiconductor film comprises a microcrystalline semiconductor.

10. The method for manufacturing the semiconductor device according to claim 6, wherein the second semiconductor film has an amorphous structure and a minute crystal grain.

* * * * *